United States Patent [19]
Yamazaki

[11] Patent Number: 5,262,396
[45] Date of Patent: * Nov. 16, 1993

[54] PLASMA-ENHANCED CVD OF OXIDE SUPERCONDUCTING FILMS BY UTILIZING A MAGNETIC FIELD

[75] Inventor: Shunpei Yamazaki, Tokyo, Japan

[73] Assignee: Semiconductor Energy Laboratory Co., Ltd., Kanagawa, Japan

[*] Notice: The portion of the term of this patent subsequent to Nov. 10, 2009 has been disclaimed.

[21] Appl. No.: 882,525

[22] Filed: May 13, 1992

Related U.S. Application Data

[63] Continuation of Ser. No. 535,302, Jun. 8, 1990, Pat. No. 5,162,296, which is a continuation of Ser. No. 241,956, Sep. 8, 1988, abandoned.

[30] Foreign Application Priority Data

| Sep. 16, 1987 | [JP] | Japan | 62-231884 |
| Sep. 16, 1987 | [JP] | Japan | 62-231885 |
| Sep. 16, 1987 | [JP] | Japan | 62-231887 |

[51] Int. Cl.$^5$ .................. B05D 3/06; B05D 3/14; B05D 5/12
[52] U.S. Cl. .................. 505/1; 505/727; 505/734; 505/737; 427/62; 427/575; 427/576; 427/598
[58] Field of Search .......... 505/1, 734, 737, 730, 505/727; 427/62, 63, 45.1, 126.3, 47, 38, 575, 576, 598, 569

[56] References Cited

U.S. PATENT DOCUMENTS

| 4,481,229 | 11/1984 | Suzuki et al. | 427/38 |
| 4,668,365 | 5/1987 | Foster et al. | 427/38 |
| 4,760,008 | 7/1988 | Yamazaki et al. | 427/39 |
| 4,776,918 | 10/1988 | Otsubo et al. | 427/38 |
| 4,939,121 | 7/1990 | Rybka | 505/1 |
| 4,963,524 | 10/1990 | Yamazaki | 505/1 |
| 4,975,411 | 12/1990 | Danby et al. | 505/1 |
| 5,032,568 | 7/1991 | Lau et al. | 505/1 |

FOREIGN PATENT DOCUMENTS 1-27132  1/1989  Japan .

OTHER PUBLICATIONS

Wall Street Journal, "Lab vs. Factory: Superconductors Pose Big Problems of Fabrication", Jul. 9, 1987.
Bonifield "Plasma Assisted Chemical Vapor Deposition" pp. 365-384 Deposition Technique for Films and Coatings Ed. by Bunshah et al. Chapt. 9. Noyes Publications 1982.
Bednorz et al. "Possible High Tc Superconductivity in the Ba-La-Cu-O System" Z. Phys. B-Condensed Matter 64 pp. 189-193 (1986).

*Primary Examiner*—Roy King
*Attorney, Agent, or Firm*—Sixbey, Friedman, Leedom & Ferguson

[57] ABSTRACT

A method for forming a superconducting oxide material including introducing an oxygen or an oxidizing gas and a reactive gas or reactive solution or reactive minute particles into a plasma generating chamber; applying a magnetic field to the plasma generating chamber; supplying microwaves to the plasma generating chamber wherein the direction of the magnetic field and the propagation direction of the microwaves are parallel such that the oxygen or the oxidizing gas and the reactive gas or reactive solution or reactive minute particles are converting into the plasma; and forming the superconducting oxide material on a film forming surface positioned in the plasma generating chamber during the application of the magnetic field.

19 Claims, 2 Drawing Sheets

PLASMA-ENHANCED CVD OF OXIDE SUPERCONDUCTING FILMS BY UTILIZING A MAGNETIC FIELD

This is a continuation application of Ser. No. 07/535,302, filed Jun. 8, 1990, now U.S. Pat. No. 5,162,296, which itself was a continuation application Ser. No. 07/241,956, filed Sep. 8, 1988, now abandoned.

BACKGROUND OF THE INVENTION

1. Field of the Invention

The present invention relates to a superconducting oxide ceramic material and a method for manufacturing such a superconducting oxide material.

2. Description of the Related Art

Recently, superconducting ceramic materials have been attracting a great deal of attention. These materials were first reported by IBM's Zurich Laboratories in the form of Ba-La-Cu-O (BALACUO) type high temperature superconducting oxide material. In addition, the YBCO ($YBa_2CuO_{6-8}$) types are also known. However, these types could be prepared only by mixing and firing various types of oxide powders to form tablets, so that even when a Tc onset of 90 K. was obtained, a sufficiently thin film was not possible. In addition, it was completely unknown that the surface portion on which the thin film is formed has non-superconductive characteristics and the same crystalline structure as the thin film.

The critical current density of these superconducting materials with polycrystalline oxide structure is small. In order to correct this problem, it is desired that all the ab surfaces of the crystal grains (also referred to as the C surface, the surface perpendicular to the C axis direction) be mutually oriented. In addition, because the difference between the coefficients of thermal expansion of the superconducting material and the substrate is large, when the superconducting material is made at temperatures higher than 650° C., especially in the high temperature range of 900° to 950° C., there is the drawback that cooling at the temperature of liquid nitrogen induces cracking and the electrical conductance is inhibited. For this reason, it has been strongly required to carry out film formation at a temperature of 500° C. or lower, so that there will be a degree of freedom in the selection of the type of substrate. Furthermore, it is strongly desired that the Tco (temperature at which resistance is zero) of the superconducting oxide material be higher. It is desirable that activation be possible at the temperature of liquid nitrogen (77 K.) or a higher temperature, and that, in turn, the Tco temperature of 90 K. or higher be available in the structure of the thin film.

With such an objective in mind, the inventor of the present invention filed Japanese Patent Application 62-75205 on Mar. 27, 1987 covering a "Method for manufacturing a superconducting material" which was a method for manufacturing a superconducting material by applying a magnetic field during a heating process.

The present invention is a further development of the above-mentioned invention.

SUMMARY OF THE INVENTION

An object of the present invention is to provide, with due consideration to the drawbacks of such conventional devices, a superconducting oxide material wherein the Tco (temperature at which resistance is zero) of the superconducting oxide material is high, and activation is possible at the temperature of liquid nitrogen or higher temperature, and that, in turn, the Tco temperature be 90 K. or higher from the structure of the thin film.

A further object of the present invention is to provide a superconducting oxide material wherein cooling at the temperature of liquid nitrogen does not induce cracking and the electrical conductance is not inhibited.

These objectives are accomplished in the present invention by the provision of a thin film of a superconducting oxide material prepared by the reaction between reactive gases or reactive minute particles in plasma wherein a magnetic field is used, and simultaneously this magnetic field is applied to the surface portion on which the thin film is formed, so that crystal orientation is obtained during the formation of the film.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

In the present invention, a thin film of a superconducting oxide material is prepared by the reaction of beyween reactive gases or reactive minute particles in plasma wherein a magnetic field is used, and simultaneously this magnetic field is applied to the surface portion on which the thin film is formed (which is hereinafter referred to as "film-forming surface portion"), so that crystal orientation is obtained during the formation of the film.

Figure 1:
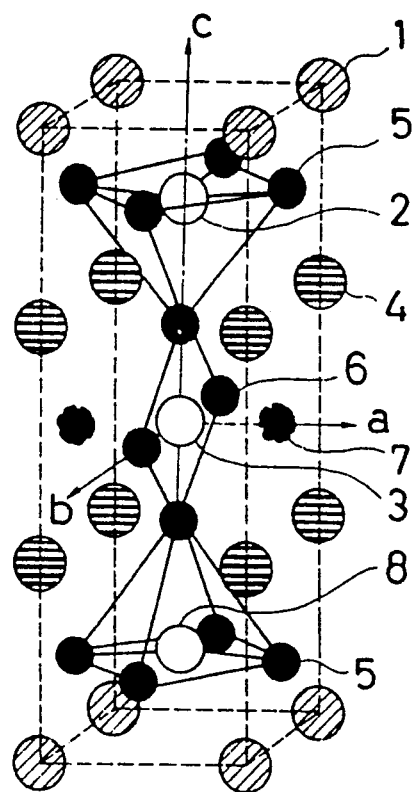
FIG. 1 is one example of the crystal structure of the superconducting oxide material for use in the present invention.
Figure 1:
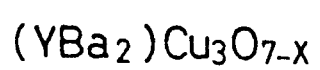

In the present invention, even if cooling is maintained at the activation (operation) temperature, the difference between the coefficients of thermal expansion never induce cracking and the like. This is because the formation temperature of the thin film in itself is low in the 200° to 500° C. range. Even at such a temperature, single crystals or polycrystals with the crystal axis uniformly oriented in the prescribed direction are produced. Then, to obtain a higher critical current density, active oxygen such as O, $O_3$ and the like which is produced in the microwave plasma extremely high efficiently is used as the reactive gas for manufacturing thin films. In addition, in order to avoid sputtering (damage) on the surface portion, the plasma CVD method is used as the method of forming the film in stead of the sputtering method, whereby a microwave with a high frequency (500 MHz to 10 GHz), typically a frequency of 2.45 GHz is used. The energy when the plasma is created in the plasma CVD method does not impart kinetic energy in a reactive gas or particles. Furthermore, when a thin film of superconducting oxide material is produced, as shown in FIG. 1, the magnetic field used for generating plasma is used parallel or roughly parallel to the a, b, or c axes of a crystal having a modified perovskeit structure. Simultaneously, by means of this magnetic field the film-forming surface portions of the crystals are positioned in a uniform direction, and magnetic axial growth occurs. In addition, in the case where single crystals are grown, magnetic epitaxial growth occurs. As a result, during the formation of a thin film, by the application of a magnetic field using 0.1 T or more, to produce plasma simultaneously on the surface portion, it becomes possible to orient the surface portion at a lower temperature, preferably at 200° to 500° C. Simultaneously, the reactive gas or reactive particles are being mutually subjected to a plasma reaction in active oxygen or a gas containing active oxygen made by means of microwaves, and on the film-forming surface portion, the superconducting oxide material reaction product forms film with the crystal axes in mutual agreement. By this method, the critical current density in the direction of, for example, the c surface (the surface parallel to the ab axis, specifically the ab surface) is improved to $1 \times 10^5$ A/cm$^2$ or greater (in this case, the ab surface can be in a direction parallel to the surface of the substrate).

A representative superconducting oxide material used in the present invention is an oxide including elements in Group IIa and Group IIIa of the Periodic Table and copper.

The superconducting material of the present invention can be generally represented by the expression $(A_{1-x} B_x)_y Cu_zO_w$, where x=0.1 to 1, y=2.0 to 4.0, preferably 2.5 to 3.5, z=1.0 to 4.0, preferably 1.5 to 3.5, and w=4.0 to 10.0, preferably 6 to 8. One representative example is a material having a modified perovskite structure represented by the expression $AB_2Cu_3O_{6-8}$. A is one type of several types of elements from among those selected from the yttrium group and those selected from the other lanthancids. The yttrium group is defined as the group containing Y (yttrium), Gd (gadolinium), Yb (ytterbium), Eu (europium), Tb (terbium), Dy (dysprosium), Ho (holmium), Er (erbium), Tm (thulium), Lu (lutetium), Sc (scandium), and other lanthanoids-Physics and Chemistry Dictionary (Iwanami Shoten, published Apr. 1, 1963).

B is one type or several types of elements from among those selected from Ba (barium), Sr (strontium), or Ca (calcium).

The superconducting oxide material illustrated in the present invention has the crystal structure shown in FIG. 1, which is a modified perovskeit structure. It has a plane including copper (2) and its neighboring oxygen (5), and another plane including copper (3), oxygen (6) positioned next to it, oxygen vacancy (7) and copper (2') and oxygen (5'). It has an element (1) from Group IIIa of the Periodic Table, for example Y, and an element (4) from Group IIa of the Periodic table, for example, Ba.

The inventor of the present invention, suggests as the mechanism which creates superconductivity, that by means of the mutual action of oxygen (5), (5') having a layer structure, and copper (2), (2') which is at the center of the layer, electrons which are paired (electron pair) shift that surface (the surface formed at the ab axes, specifically the surface parallel to the c surface). Up to this time, mutual action with a phonon was considered to be the cause of the formation of the paired electrons, based on the BCS theory.

However, the inventor of the present invention hypothesizes a theory that a quasiparticle known as a magnon is created when upper and lower oxygen vacancies (7) between which this laminar structure (the other vacancy exists in the atomic system which is positioned on the upper or lower side of the diagram) is associated with each other or with a rare earth element (1) which is a screw magnetic body, and that the quasiparticle acts as an intermediary to form a pair of electrons spinning in opposite directions. Specifically, the magnon fluctuates in the c axis direction in the drawing (the fluctuation of the magnon in the direction perpendicular to the ab surface is best reflected in the electron pair), and this magnon, which draws one of the electrons in pair having spinning in mutually opposite directions, is repelled by the other. The magnon not completely in evidence but works behind the scenes, and the electron pairs shift in the direction parallel to their respective a-b axes in a surface with a laminar structure (surface made from (2), (5) and surface made from (2'), (5')). This can be considered as the cause of superconductance. In addition, it is possible to consider that the fluctuation of the oxygen vacancy is the fluctuation of the phonon, and therefore to have a pattern which supplements the BCS theory, in which it can be considered that the phonon, through the medium of the magnon, indirectly causes the electron pair to form.

Because the magnetic field in this principle of action causes a major effect, a mutual reaction is obtained between a magnetic field and an electric field applied throughout a plasma atmosphere from external sources during film formation to produce a plasma from a reactive gas or of minute reactive particles for mutual action. Furthermore, the magnetic field used in plasma generation is utilized, so that the film-forming surface portion is positioned parallel to or perpendicular to this magnetic field in a strong region, whereby all crystals are uniformly positioned in the prescribed direction during the formation of the film.

In addition, by the application of a microwave electric field in a direction perpendicular to this magnetic field, specifically, in the direction of the ab surface where the current flows during superconductivity, the ease of this orientation can be promoted. In particular, by active mutual use of the electrical and magnetic fields, this reactive pressure is not at the low pressure of $10^{-3}$ to 0.1 torr used in the generally known plasma CVD method and the ECR (electronic cyclotron resonance) method but at an extremely high pressure of high plasma density of 1 to 800 torr, with plasma generation in a possible hybrid resonance region. Here, by carrying out a reaction to completion by mutual use of reactive gas, reactive particles and active oxygen, the reaction products are oriented along the c axis following the magnetic field. For this reason, the C axis of the reaction products is oriented and stored at the surface portion, following the direction of the magnetic field. Thus, it is possible to make the film easier, making the restriction on the types of substrates loosened. Further, it is desirable to be able to form a polycrystal film in which the respective crystal axes of the polycrystals are in agreement or roughly in agreement, by the application of the magnetic field while heating. It is desirable that magnetic epitaxial growth at a low temperature should occur, specifically that a single crystal thin film be formed, by using a substrate having crystal orientation in which the axes of orientation are in agreement with this growth surface.

In this case, the superconducting oxide material used in the present invention is obtained from a single crystal film at a low temperature. Furthermore, the critical current densities along the C plane are larger than those normal to the C plane by two or much orders of magnitude. For this reason, when using polycrystals, it is extremely important that polycrystals having scattered crystal orientations be arranged to have the crystal axis positioned in one direction in order to obtain a high critical current density.

The present invetion is a method of forming a thin film which forms a superconducting oxide material, wherein an organic reactive gas of the starting material element, finely divided minute particles of a superconducting oxide material produced by preliminarily firing the starting material, or minute particles of a salt of the starting elements, are introduced or splayed into a plasma under atmospheric pressure or reduced pressure in which there is an abundance of active oxygen.

In the present invention, it was discovered that after formation of the film, during heat annealing in the same reaction furnace as required, a large part or all of the crystals, specifically the crystals which are being arranged as polycrystals, can be made to grow by the application of magnetic field, which is desirably 0.1 Tesra (T) or greater, and typically 0.3 to 5 T, in the same direction as this magnetic field or in a rearranged direction close to it. Then it was discovered that crystals are easily provided in the C axis direction of the magnetic field.

In this way one crystal particle developing into a polycrystal can become larger. In turn, because adjacent crystals have the same crystal axis in common, the barrier at the crystal boundary has more of a tendency to disappear, and a single crystal structure can be obtained. Then, the respective crystals can all become adjusted at the ab surface (the surface perpendicular to the C axis). As a result, by the method of the present invention, the critical current density, which up to the present has been $10^2$ A/cm$^2$ (77 K) in the case of random crystal orientation, increases up to $10^4$ to $10^6$ A/cm$^2$ (measured at 77 K) with the current flowing parallel to the ab surface, and can become equal in density to a single crystal or close to about the 1/5 level. Then, it becomes easier to make thin film of single crystal structure of large area, which is ideal for a superconducting oxide material.

In the present invention, in preparing a superconducting thin film with such an axis arrangement, a magnetic field is applied perpendicular or horizontal with respect to the surface portion on which the thin film surface is created, and by the application perpendicular to the magnetic field of a microwave electric field for generating active oxygen, the temperature at which the film is formed is effectively lowered.

In addition, it is effective to conform the crystal axis of the substrate constructing the film-forming surface portion to the direction of arrangement of the crystals adjusted by the magnetic field. For example, the crystal substrate of MgO (magnesium oxide), SrTiO$_3$ (strontium titanium oxide), and YSZ (yttrium stabilized zircon) having a (100) direction can be used, and a magnetic field applied in the direction perpendicular to the film-forming surface portion, wherein it is possible to form the ab surface parallel to the film-forming surface portion. In addition, using these crystal substrates which have a (110) direction, when a magnetic field is applied parallel to the film-forming surface portion, it is possible to obtain the ab surface formed in the direction perpendicular to the film-forming surface portion by heat and magnetic field annealing after the film is deformed. Then it is possible to obtain a thin film of a single crystal or a thin film including polycrystals in a shape close to the single crystal.

EMBODIMENT NO. 1

Figure 2:
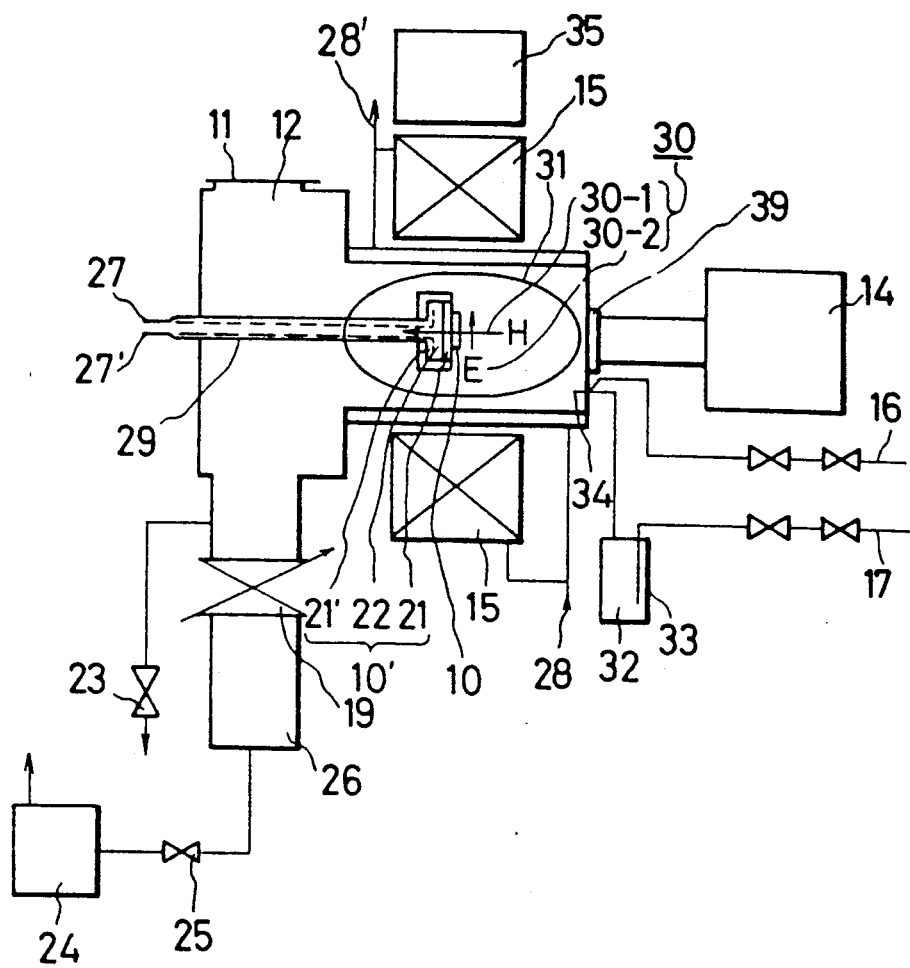
FIG. 2 is a diagram showing a magnetically applied microwave plasma reaction device used in the present invention.

Now referring to FIG. 2, this drawing shows the magnetically applied microwave plasma CVD device used in the present invention.

The device in this drawing comprises a plasma generating chamber 31 which can be maintained at atmospheric pressure or at a reduced pressure, an auxiliary space 12, a cylindrical electromagnet 15 which generates a magnetic field, a power source 35 for the electromagnet 15, a microwave oscillator 14, a vacuum pump 26 for an exhaust gas system, a rotary pump 24, a pressure adjusting valve 19, a substrate holder 10', a substrate 10 for forming a film, a microwave introduction window 39, a plurality of gas systems 16, 17, a plurality of water cooling systems 28, 28', a rod 29 for removing the substrate 10 and substrate holder 10', and a plurality of water cooling systems 27, 27' for cooling and maintaining at a suitable temperature through the inside of the rod 29 a surface portion on which the film is formed.

The substrate holder 10' is provided with a buffer layer 21, 21' and a cooling layer 22 to convert the substrate surface which has overheated from the plasma in the plasma generating chamber 31 to a suitable temperature, and to maintain the substrate surface at a specified temperature, for example, 200° to 500° C. The cooling layer 22 is formed from iron, nickel, or cobalt, all of which are ferromagnetic materials, and one part is hollow to allow circulation of the cooling water in the system 27, 27'. The buffer layer 21, 21' is formed of a non-magnetic, heat resistant material such as ceramic, stainless steel, or glass. The cooling layer 22 of the ferromagnetic member strengthenes the magnetic field at the surface of the substrate, and in order to avoid having it reduced to paramagnetism from overheating, it is shielded from heat by the buffer layer 21, 21'.

First, the substrate 10 for forming a thin film is set on the substrate holder 10', and this system is positioned in the plasma generating chamber 31 through a gate valve 11. In this embodiment of the present invention, a silicon wafer is used as a substrate which has an insulating film formed for an IC on one part of its top surface, and the MqO, SrTiO$_3$ or YSZ type with a (100) or (110) surface can also be used as a substrate.

When operating at atmospheric pressure, the valve 19 is closed and the valve 23 opened. In addition, when operating under reduced pressure, the valves 19 and 25 are opened and the valve 23 is closed, and the vacuum pump 26 and the rotary pump 24 may be operated.

A liquid 32 into which a reactive gas or fine particles are blended is mixed and enclosed in a bubbler 33. In the case where the chemical vapor reaction method is used, oxygen 17 is bubbled into the liquid 32 which may be released into the plasma generating chamber 31 through a tip 34 with the oxygen.

If the spray method is used, the tip 34 can be used as a spray nozzle. Oxygen or air can be pressurized and introduced from the gas system 16, and a solution using the liquid 32 may be ejected through the tip 34 under pressure.

In the manufacturing process, a vacuum of $1 \times 10^{-4}$ or less is first applied to the entire system using the mechanical booster (vacuum) pump 26 and the rotary pump 24. Next, a nonproduct gas (this is an oxidizing gas which does not itself form a solid body after a decomposition reaction), N$_2$O, NO, NO$_2$, air or oxygen, for example, the oxygen (6) is passed through the 2000 SCCM gas system 16 and introduced into the plasma generating chamber 31 where it is pressurized to 30 torr. An external microwave of 500 MHz or greater, for example a microwave 30-2 of a frequency of 2.45 GHz, is applied from the microwave oscillator 14 at a strength of 0.5 to 5 KW, for example, 1.5 KW. In addition, by using a magnet 15 water-cooled as shown by 18, 18', magnetic field 30-1 is applied, wherein an electric current flows through the magnet 15 to obtain at a critical of about 1 T at the surface of the substrate 10, and a high density plasma with hybrid resonance is generated in the plasma generating chamber 31. At this time a magnetic field 30-1 and an electric field 30-2 are mutually at right angles. In the drawing, the magnetic field 30-1 is applied perpendicular to the surface portion on which the film is formed. By means of this high density plasma, active oxygen at almost 100% ionization can be created.

Next, a solution is formed of organic elements which form the superconducting oxide material in this reaction system, for example, alkylated or halogenated componds such as, for example, $Y(OC_2H_5)_3$ (triethoxy yttrium), $Ba(OC_2H_5)_3$ (triethoxy barium), $CuBr_3$ (cupric bromide), and the like, dissolved in an organic solution such as benzone or alcohol or the like, or in an aqueous solution, in the ratio of Y:Ba:Cu of 1:2:3 after forming the film. For example, oxygen is bubbled through these mixed solutions so that these are introduced throughout the plasma with oxygen.

In addition, as another method, ammonia-neutralized salt products such as $YBr_3$, $BaBr_2$, $CuBr_2$ or $Y(NO_3)_3$, $Ba(NO_3)_2$, $Cu(NO_3)_2$ and the like are dissolved in water or organic solutions, and, using the spray method in which oxygen or air is blown into these solutions under high pressure, they are introduced into the reaction chamber to which a magnetic field is applied. The ratio of oxygen as a carrier gas to the reactive gas is in the range of 3000 to 1 (100 in this case).

Also, as still another method, a previously prepared composition of conducting oxide material containing elements from Groups IIa and IIIa of the Periodic Table and copper may be finely powdered and mixed into a solution, the mixed solution atomized by the spray or bubbler 33, and released into the plasma generating chamber 31 so that an oxidizing reaction is carried out to completion in the magnetic field space.

In this way, when hybrid resonance is obtained by mutual utilization of microwave energy and a magnetic field, the plasma temperature is much higher than 1150° C. (the melting temperature of the conducting oxide material), being as high as the 3000° to 10,000° C. range, so that the reactive atoms which are excited at such a high energy are sufficiently activated, and are formed on the film-forming surface portion in the inherent crystal structure. A thin film of this superconducting oxide material can be accumulated on the film-forming surface portion of the substrate 10 on the substrate holder 10' which is cooled to a low temperature by the cooling layer 22 so that the temperature of the substrate itself is in the low range of 200° to 500° C.

Then, by annealing at 400° C. after the film is formed, as indicated in FIG. 1, it is possible to form a thin film superconducting oxide material with a modified perovskeit structure of rhombic crystals with a thickness of 1 μm to 1 mm.

In FIG. 2, one ring-shaped magnet 15 is used for generating the magnetic field 30-1.

As a result, in the plasma generating chamber 31 there is also a region (within 875 gauss±185 gauss) which has mutual electric and magnetic field action, and there are many other regions which have an even greater magnetic strength.

Then, the substrate 10 is positioned in the region which has the maximum magnetic field (here, it is the section centered around the magnet 15). Therefore, in the case of the arrangement shown in FIG. 1, the magnetic field 30-1 is applied perpendicular to the film-forming surface portion on the substrate, and the electrical field 30-2 is applied parallel to that surface. From the strength of the magnet, a region of 875 gauss which satisfies hybrid resonance conditions can be created in the space between the film forming surface in the plasma generating chamber 31 and the nozzle 34 for introducing the gas.

The material for producing the oxide superconducting film is formed into a film on the film-forming surface portion of the substrate in the direction of the magnetic field along the C axis through the activated dissociation reaction in the area of hybrid resonace.

The critical current density of the superconducting oxide film made at this time was measured at $8.8 \times 10^4$ $A/cm^2$ parallel to the substrate surface.

Specifically, the crystal structure shown in FIG. 1 was sufficiently formed at the time the film was formed and in the subsequent annealing. Also, it was apparent from the results of X-ray analyses that the c axis was formed in the direction parallel to the magnetic field, specifically, in the direction perpendicular to the film-forming surface portion.

EMBODIMENT NO. 2

The material represented by the expression $Y_{0.5}Yb_{0.5}BaSrCu_3O_{6-8}$ was used as a component. Specifically, the substrate 10 and the holder 10' were placed at right angles respective to the plane of the drawing sheet (in the lateral direction on the drawing) and the substrate was maintained at 500° C. In this way, the c axis could be made along the film-forming surface portion, with the ab surface of the superconducting oxide thin film in the perpendicular direction. The other deposition conditions are substantially the same as in Embodiment No. 1. As a result, a critical current density of $3.6 \times 10^4$ $A/cm^2$ and a Tco of 93 K. were obtained for the superconducting oxide thin film which was formed on the film-forming surface portion of for example, a glass, alumina, or $ZrO_2$ substrate or the like of polycrystal or amorphous structure.

EMBODIMENT NO. 3

The substrate of Embodiment No. 1 was changed to a singlecrystal of MgO (100) or $SrTiO_3$ (100). Then a magnetic field of 2T was applied throughout film-forming on the film-forming surface portion, and the substrate temperature was maintained at 450° C. A single crystal thin film of 1 $cm^2$ or greater and 3.5 μm thickness was obtained on the substrate. A critical current density of $2.3 \times 10^6$ $A/cm^2$ (77 K.) and a Tco of 97 K. were obtained.

EMBODIMENT NO. 4

The substrate of Embodiment No. 2 was changed to a single crystal of MgO (110) or $SrTiO_3$ (100). Then a magnetic field of 2T was applied on the film-forming surface portion, and the substrate temperature was maintained at 450° C. A single crystal thin film of about 5 $mm^2$ and 3 μm thickness was obtained on the substrate. A critical current density of $1.7 \times 10^6 A/cm^2$ on a surface parallel to the ab surface and a Tco of 95 K. were obtained.

EMBODIMENT NO. 5

In this embodiment, a substrate with the superconducting oxide material made in the Embodiment No. 1 was heat annealed for 15 hours at a temperature of 300° to 500° C. in an activated oxygen atmosphere of microwave plasma. At this time, the magnetic field 30-1 was applied by the device shown in FIG. 2 in the c axis direction corresponding to a previously prepared crystal surface. Also, the electrical field 30-2 was applied at $10^3$ to $5 \times 10^4$ V/cm in the direction perpendicular to the magnetic field. As a result, it was possible to improve the Tco even more by about 100 K., and 230 to 280 K. was obtained. A critical current density of $6.0 \times 10^5$ A/cm2 was also obtained.

In the present invention, the material obtained is in the form of thin film. However, different forms can also be obtained, such as a film structure 3 to 30 $\mu$m thick, a band structure, or a wire structure, according to the needs in the market.

By using the above-mentioned device of the present invention, it has become possible to create a thin film superconducting oxide material, conforming to the crystal axis, which acts at temperatures equivalent to the temperature of liquid nitrogen or higher, a condition which up to now has been impossible to obtain. It is also possible to make a polycrystal superconducting oxide thin film with orientation on the surface of an amorphous glass, silicon oxide, or silicon nitride substrate or the like. In the case where the growth of the crystal structure is in a direction in agreement with the substrate crystal axis, it is possible for the first time to utilize this material as a lead wire wherein electric contacts are possible at the electrode section of a semiconductor integrated circuit without performing a direct oxidizing reaction with the semiconductor, because an oriented film can be obtained at a substrate temperature in the 200° to 500° C. range.

In addition, in order to form a laminated structure with the polycrystal structure of the compounds of the materials obtained in this manner, mixtures of various elements from Groups IIa and IIIa of the Periodic table can be obtained. As shown in the present invention, because a more uniform molecule arrangement can be obtained by applying a magnetic field during heating, it is possible to eliminate voids and reduction in the height of barrier at crystal grain boundaries in the final compound, and in turn it is assumed that a higher Tco and Tc-onset can be obtained.

Next, the present invention will be explained with reference in other form of embodiments. In these embodiments, another step is included, specifically, the reactive gas or reactive minute particles which impair the superconductive characteristics are added simultaneously, a mutual reaction is obtained in the plasma using a magnetic field, and this magnetic field is simultaneously applied to the film-forming surface portion, thereby obtaining the crystal orientation during film-forming.

This non-superconducting material is provided on the upper section of the substrate. By laminating a superconducting oxide material with the same crystal structure conforming to the crystal axis to this non-superconducting material, a two-layer structure is obtained in which both layers have the same coefficient of thermal expansion. Therefore, cracks and the like are not generated because of the difference in coefficient of thermal expansion between two-layer structure and the substrate, and even when cooling is applied to maintain the material at the active temperature, single crystals or polycrystals oriented in the direction of the specified crystal axis are produced. Then, in order to obtain a higher critical current density in the superconducting thin film laminated on the non-superconducting material, reactive oxygen such as O, $O_3$, and the like, made at an extremely high efficiency with the microwave plasma in manufacturing these thin films is used as the reactive gas. In order to prevent the creation of a mixed phase of the superconducting oxide material and the material of the film-forming surface portion when sputtering on the film forming surface portion, a sputtering method or a low frequency plasma CVD method at 1 KHz to 1 MHz is not used. Instead a high frequency (500 MHz to 10 GHz) microwave, typically 2.45 GHz, is used, and the energy when the plasma is formed is not given as the kinetic energy to the reactive gas or particles. When the thin film of the superconducting oxide material is produced a magnetic field for generating plasma is used simultaneously, so that the a, b, or c axes of crystals with a modified perovskeit structure as shown in FIG. 1, are parallel or roughly parallel to the desired direction conforming to the application. By means of this magnetic field, the growing surfaces of the crystals are positioned in a uniform direction, and magnetic epitaxial growth occurs. In addition, in the case where single crystals are grown, magnetic epitaxial growth occurs. As a result, during the formation of the thin film, by the application of a magnetic field using 0.1 T or more, which is used for plasma creation during film forming, it becomes possible to orient the film at the film-forming surface portion. Simultaneously, the reactive gas or reactive particles are being mutually subjected to a plasma reaction in active oxygen or a gas containing active oxygen made by means of microwaves, and the superconducting oxide material reaction product forms film on the film-forming surface portion with the crystal axes in mutual agreement. By this method, the critical current density in the direction of, for example, the c surface (the surface parallel to the ab axis, specifically the ab surface) is improved to $1 \times 10^5$ A/cm$^2$ or greater (in this case, the ab surface can be in a direction parallel to the surface of the substrate).

In these embodiments, the superconducting oxide material and method for manufacturing it are the same as in the previously discussed embodiments, so further description will be omitted.

Additives used in these embodiments are selected from a group including copper (Cu), the rare earth elements, iron (Fe), nickel (Ni), cobalt (Co), silicon (Si), germanium (Ge), boron (B), aluminum (Al), gallium (Ga), phosphorus (P), titanium (Ti), tantalum (Ta), and magnesium (Mg), used in the amount of 1 to 30 atomic %. Particularly desirable elements are aluminum or magnesium. If these are added at 2 to 10 atomic % when the film is being formed, a film with non-superconducting characteristics is obtained. Then a film with no additives, specifically, a superconducting film with the same crystal structure and same crystal axes, is laminated to the top or bottom of the non-superconducting film so that there is no difference in the coefficients of thermal expansion and therefore no cracks are produced at the temperature of actual use.

In these embodiments, first the non-superconducting film is formed using the same principle as in the previous embodiments, then the superconducting film is formed and laminated to the non-superconducting film.

In this manner, one crystal grain in polycrystalline structure can become large, and, in turn, because adjacent crystals have the same crystal axis in common, the barrier at the crystal boundary has more of a tendency to disappear and a single crystal structure can be obtained. Then, the respective crystals can all be arranged in the ab surface (the surface perpendicular to the C surface). As a result, by the method of the present invention, a superconducting oxide material of the same structure as a non-superconducting material is made without any additives and formed on the film of non-superconducting material, so that the critical current density, which up to the present has been $10^2$ A/cm$^2$ (77K) in the case of random crystal orientation, increases up to $10^4$ to $10^6$ A/cm$^2$ (measured at 77K) with the current flowing parallel to the ab surface, and can become equal in electric density to a single crystal or close to about the 1/5 level.

In the present invention, in producing a superconducting thin film with such an axis arrangement, a magnetic field is applied in a perpendicular or horizontal relationship with respect to the film-forming surface portion, and by the application of a microwave electric field perpendicular to the magnetic field to generate active oxygen, the temperature at which the film is formed is effectively lowered.

An explanation will now be given for specific embodiments, but basically the method of manufacturing these embodiments is the same as for the Embodiments Nos. 1 to 5. Here, prior to the formation of a superconducting film, exactly the same method is used to produce the non-superconducting film (except that, additives which destroy the superconductivity are added to the organic solution of the elements which form the superconducting material). An explanation will be given for the formation of the non-superconducting film only, and the explanation for the formation of the superconducting film will be omitted.

EMBODIMENT NO. 6

The method used in this embodiment followed the method used to Embodiment No. 1, except that a non-superconducting film was first formed by the use of additives to destroy the superconducting characteristics. The additives used were, for example, reactive gases, such as Al(C$_2$H$_5$)$_3$, Mg(C$_2$H$_5$)$_3$, and the like, and halogenated materials such an AlBr$_3$, MgBr$_2$, AlCl$_3$, MgCl$_2$, and the like. They were added to the solution for producing the superconducting in the prescribed quantities, for example, 10 atomic %. Oxygen was added to the mixed solutions by bubbling and these solutions were introduced to the plasma together with the oxygen.

The material for manufacturing the non-superconducting oxide thin film was subjected to an activated dissociation reaction in a region of hybrid resonance, and the film was formed parallel to the c axis and the magnetic field (the direction perpendicular to the magnetic field surface on the film-forming surface portion of the substrate 10 which is activated to have magnetic field.

The non-superconducting oxide film formed at this time can be represented by the general expression IIIa$_{1-x}$X$_x$IIa$_{2-y}$Y$_y$Cu$_3$O$_{6-8}$, where x and y are the additives, with x=0.01 to 0.3, y=0.01 to 0.3. In this expression, X=Al, Y=Mg, x=0.02, and y=0.03. This material had a specific resistance of $3 \times 10^4$ Ω cm and exhibited absolutely no superconductivity at the temperature of liquid nitrogten. The results of X-ray analysis clearly showed that this film had a modified perovskeit structure with the c axis in the same direction as the magnetic

EMBODIMENT NO. 7

The components used gave a material represented by the general expression Y$_{0.5}$Yb$_{0.5-x}$Al$_x$BaSrCu$_3$O$_{6-8}$, where x=0.01 to 0.3, for example, to give Y$_{0.5}$Yb$_{0.4}$Al$_{0.1}$BaSrCu$_3$O$_{6-8}$ when x=0.1. Specifically, in the device of FIG. 2, the substrate 10 and substrate holder 10' were positioned at right angles to FIG. 2 (the surface is directed in the right to left direction in the drawing), and the temperature of the substrate was maintained at 500° C. In this way it was possible to form the ab surface of the non-superconducting oxide thin film in the perpendicular direction with the c axis parallel to the film-forming surface portion. As a result, a thin film of non-superconducting material with a modified perovskeit structure was obtained on a film forming surface of a substrate of, for example, polycrystal such as glass, alumina, ZrO$_2$ and the like or of an amorphous structure. A specific resistance of $10^5$ Ω cm was obtained.

EMBODIMENT NO. 8

The substrate in Embodiment No. 6 was changed to single crystals of MgO (100) or SrTio$_3$ (100). Then a magnetic field of 2 T was applied throughout the film on the film-forming surface portion and the temperature of the substrate was maintained at 450° C. A thin film of a non-superconducting oxide material represented by the general expression Y$_{0.9}$Al$_{0.1}$Ba$_2$Cu$_3$O$_{6-8}$ was formed on the substrate to a thickness of 3 μm. Then a thin film of a superconducting oxide material represented by the general expression YBa$_2$Cu$_3$O$_{6-8}$ was formed over the non-superconducting film to a thickness of 2 μm. In this way it was possible to obtain a single crystal thin film of 1 cm$^2$ or larger on the substrate. A critical current density of $3.3 \times 10^6$ A/cm$^2$ (at 77K) and a Tco of 99K were obtained. Because there was no thermal distortion in the base of the substrate, it could be assumed that this was an improved material.

EMBODIMENT NO. 9

The substrate in Embodiment No. 6 was changed to single crystals of MgO(110) or SrTiO$_3$(110). Then a magnetic field of 2T was applied throughout the film on the film-forming surface portion and the temperature of the substrate was maintained at 450° C. Then a single crystal thin film of about 5 mm$^2$ in size represented by the general expression YBa$_2$Cu$_3$O$_{6-8}$ was formed on the substrate to a thickness of 3 μm. Following this, a material represented by the general expression Y$_1$Ba$_{2-x}$Mg$_x$Cu$_3$O$_{6-8}$ where x=0.01 to 0.3, for example Y$_1$Ba$_{1.9}$Mg$_{0.1}$Cu$_3$O$_{6-8}$ was formed to a thickness of 0.2 μm to give a protective film for the thin film of the non-superconducting oxide material. A critical current density of $2.2 \times 10^6$ A/cm$^2$ was obtained for the superconducting material in the direction parallel to the ab surface. A Tco of 97K was obtained. In addition, a specific resistance of $10^4$ Ωcm was obtained in the thin film of the non-superconducting material.

By means of the present invention, it has become possible to prepare, with its crystal axes uniformly oriented, a thin film of a non-superconducting oxide material which can withstand usage at temperatures equivalent to or higher than the temperature of liquid nitrogen. This has previously been impossible. It has also become possible to prepare a thin film of a superconducting oxide material with the same crystal axes and same structure and prepared in the same manner as the non-superconducting oxide material, and to laminate this superconducting oxide material to the top, bottom, or both sides of the non-superconducting oxide material. For this reason, even when subjected to change in temperature, this superconducting oxide material does not suffer thermal expansion distortion around its periphery where it joins the insulating material, but exhibits high reliability. It is also possible to fabricate an oriented polycrystalline oxide non-superconducting thin film on a surface of a substrate of an amorphous structure made of glass, silicon oxide, or silicon nitride and the like.

Superconducting ceramics for use in accordance with the present invention also may be prepared in consistence with the stoichiometric formulae $(A_{1-x}B_x)_y Cu_z O_w$, where A is one or more elements of Group IIIa of the Periodic Table, e.g., the rare earth elements, B is one or more elements of Group IIa of the Periodic Table, e.g., the alkaline earth metals including beryllium and magnesium, and $x=0$ to 1; $y=2.0$ to 4.0, preferably 2.5 to 3.5; $z=1.0$ to 4.0, preferably 1.5 to 3.5; and $w=4.0$ to 10.0, preferably 6.0 to 8.0. Also, superconducting ceramics for use in accordance with the present invention may be prepared consistent with the stoichiometric formulae $(A_{1-x}B_x)_y Cu_z O_w$, where A is one or more elements of the Priodic Table such as Bi, Sb and As, B is one or more elements of Group IIa of the Periodic Table, e.g., the alkaline earth metals including beryllium and magnesium, and $x=0.3$ to 1; $y=2.0$ to 4.0, preferably 2.5 to 3.5; $z=1.0$ to 4.0, preferably 1.5 to 3.5; and $w=4.0$ to 10.0, preferably 6.0 to 8.0. Examples of this general formula are $BiSrCaCaCu_2O_x$ and $Bi_4Sr_3Ca_3Cu_4O_x$. Tc onset and Tco samples confirmed consistent with the formula $Bi_4Sr_yCa_3Cu_4O_x$ (y is around 1.5) were measured to be 40 to 60K, which is not so high. Relatively high critical temperatures were obtained with samples conforming to the stoichiometric formulae $Bi_4Sr_4Ca_2Cu_4O_x$ and $Bi_2Sr_3Ca_2Cu_2O_x$. The number designating the oxygen proportion is 6 to 10, e.g. around 8.1.

What is claimed is:

1. A method for forming a copper oxide superconducting material on a substrate comprising the steps of:
   placing a substrate in a reaction chamber;
   inputting oxygen or an oxidizing gas and a reactive solution for forming a copper oxide superconducting material into said chamber;
   inputting an electromagnetic energy into said reaction chamber in order to activate said reactive solution; and
   forming said copper oxide superconducting material on said substrate,
   wherein a magnetic field is applied to said substrate in a parallel or perpendicular direction to a surface of said substrate in order to align a crystalline structure of said material in accordance with said direction.

2. A method as in claim 1 where said reactive solution is selected from the group consisting of: (a) alkylated or halogenated compounds including a rare earth, alkaline earth, and copper elements of the superconducting oxide material; (b) ammonianeutralized salt products including the rare earth, alkaline earth, and copper elements; and (c) a finely powdered composition containing elements from Groups IIa and IIIa of the Periodic Table and copper.

3. A method as in claim 1 where the strength of said magnetic field is at least 0.1 Tesla.

4. A method as in claim 1 wherein the superconducting material is represented by a general formula:

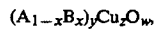

where $0.1 < x < 1$, $2.0 < y < 4.0$, $1.0 < z < 4.0$ and $4.0 < w < 10.0$;
where A is one or more elements selected from the group consisting of Y, Gd, Yb, Eu, Tb, Dy, Ho, Er, Tm, Lu, Sc and other lanthanoid; and
B is one or more elements selected from the group consisting of Ba, Sr and Ca.

5. A method as in claim 1 wherein the superconducting material is represented by a general formula:

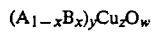

where $0.3 < x < 1$, $2.0 < y < 4.0$, $1.0 < z < 4.0$ and $4.0 < w < 10.0$;
where A is one or more elements selected from the group consisting of As, Sb and Bi;
B is one or more elements selected from the group consisting of Be, Mg, Ca, Sr and Ba.

6. A method as in claim 1 where said electromagnetic energy is a microwave.

7. A method for forming a copper oxide superconducting material on a substrate comprising the steps of:
   placing a substrate in a reaction chamber;
   inputting oxygen or an oxidizing gas and a reactive gas or reactive particles including precursor materials for forming a copper oxide superconducting material into said chamber;
   inputting an electromagnetic energy into said reaction chamber in order to activate said reactive gas or reactive minute particles; and
   forming said copper oxide superconducting material on said substrate,
   wherein a magnetic field is applied to said substrate in a parallel or perpendicular direction to a surface of said substrate in order to align a crystalline structure of said material in accordance with said direction.

8. A method as in claim 7 where said reactive gas or reactive particles is selected from the group consisting of: (a) alkylated or halogenated compounds including a rare earth, alkaline earth, and copper elements of the superconducting oxide material; (b) ammonia-neutralized salt products including the rare earth, alkaline earth, and copper elements; and (c) a powdered composition containing elements from Groups IIa and IIIa of the Periodic Table and copper.

9. A method as in claim 7 wherein the superconducting material is represented by a general formula:

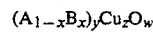

where $0.1 < x < 1$, $2.0 < y < 4.0$, $1.0 < z < 4.0$ and $4.0 < w < 10.0$;
where A is one or more elements selected from the group consisting of Y, Gd, Yb, Eu, Tb, Dy, Ho, Er, Tm, Lu, Sc and other lanthanoid; and B is one or more elements selected from the group consisting of Ba, Sr and Ca.

10. A method as in claim 7 wherein the superconducting material is represented by a general formula:

$$(A_{1-x}B_x)_y Cu_z O_w$$

where $0.3 < x < 1$, $2.0 < y < 4.0$, $1.0 < z < 4.0$ and $4.0 < w < 10.0$;

where A is one or more elements selected from the group consisting of As, Sb and Bi;

B is one or more elements selected from the group consisting of Be, Mg, Ca, Sr and Ba.

11. A method as in claim 8 where said electromagentic energy is a microwave.

12. A method for forming a copper oxide superconducting material on a substrate comprising the steps of:
placing a substrate in a reaction chamber with the surface of said substrate showing (100) plane;
inputting oxygen or an oxidizing gas and a reactive solution for forming a copper oxide superconducting material into said chamber;
inputting an electromagnetic energy into said reaction chamber in order to activate said reactive solution; and
forming said copper oxide superconducting material on said substrate,
applying a magnetic field to said substrate in a perpendicular direction to the surface of said substrate in order to align a crystalline structure of said material in accordance with said direction.

13. A method as in claim 12 where the strength of said magnetic field is at least 0.1 Tesla.

14. A method for forming a copper oxide superconducting material on a substrate comprising the steps of:
placing a substrate in a reaction chamber with the surface of said substrate showing (110) plane;
inputting oxygen or an oxidizing gas and a reactive solution for forming a copper oxide superconducting material into said chamber;
inputting an electromagnetic energy into said reaction chamber in order to activate said reactive solution; and
forming said copper oxide superconducting material on said substrate,
applying a magnetic field to said substrate in a parallel direction to the surface of said substrate in order to align a crystalline structure of said material in accordance with said direction.

15. A method as in claim 14 where the strength of said magnetic field is at least 0.1 Tesla.

16. A method for forming a copper oxide superconducting material on a substrate comprising the steps of:
placing a substrate in a reaction chamber with the surface of said substrate showing (100) plane;
inputting oxygen or an oxidizing gas and a reactive gas or reactive particles including precursor materials for forming a copper oxide superconducting material into said chamber;
inputting an electromagnetic energy into said reaction chamber in order to activate said reactive gas or minute particles; and
forming said copper oxide superconducting material on said substrate,
applying a magnetic field to said substrate in a perpendicular direction to the surface of said substrate in order to align a crystalline structure of said material in accordance with said direction.

17. A method as in claim 16 where the strength of said magnetic field is at least 0.1 Tesla.

18. A method for forming a copper oxide superconducting material on a substrate comprising the steps of:
placing a substrate in a reaction chamber with the surface of said substrate showing (110) plane;
inputting oxygen or an oxidizing gas and a reactive gas or reactive particles including precursor materials for forming a copper oxide superconducting material into said chamber;
inputting an electromagnetic energy into said reaction chamber in order to activate said reactive solution; and
forming said copper oxide superconducting material on said substrate,
applying a magnetic field to said substrate in a parallel direction to the surface of said substrate in order to align a crystalline structure of said material in accordance with said direction.

19. A method as in claim 18 where the strength of said magnetic field is at least 0.1 Tesla.

* * * * *